(12) United States Patent
Chen et al.

(10) Patent No.: US 9,996,657 B2
(45) Date of Patent: Jun. 12, 2018

(54) SYSTEMS AND METHODS FOR GENERATING A MULTIPLE PATTERNING LITHOGRAPHY COMPLIANT INTEGRATED CIRCUIT LAYOUT (71) Applicant: Taiwan Semiconductor Manufacturing Company Limited, Hsinchu (TW)

(72) Inventors: Chun-Chen Chen, Hsinchu (TW); Sheng-Hsiung Chen, Hsinchu (TW); Fong-Yuan Chang, Hsinchu (TW); Shao-Huan Wang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days. days.

(21) Appl. No.: 15/221,676

(22) Filed: Jul. 28, 2016

(65) Prior Publication Data

US 2018/0032661 A1 Feb. 1, 2018

(51) Int. Cl.
*G06F 17/00* (2006.01)
*G06F 17/50* (2006.01)

(52) U.S. Cl.
CPC ...... *G06F 17/5081* (2013.01); *G06F 17/5072* (2013.01)

(58) Field of Classification Search
CPC ....................................... G06F 17/50

USPC .......................................... 716/52
See application file for complete search history.

(56) References Cited

U.S. PATENT DOCUMENTS

| 2003/0135839 | A1* | 7/2003 | Wu | G03F 1/30 716/52 |
|---|---|---|---|---|
| 2005/0287444 | A1* | 12/2005 | Graur | G03F 1/30 430/5 |
| 2011/0078638 | A1* | 3/2011 | Kahng | G06F 17/50 716/52 |
| 2013/0086543 | A1* | 4/2013 | Agarwal | G06F 17/5072 716/119 |
| 2013/0159955 | A1* | 6/2013 | Ghaida | G06F 17/5068 716/119 |

* cited by examiner

*Primary Examiner* — Mohammed Alam
(74) *Attorney, Agent, or Firm* — Jones Day (57) ABSTRACT

Computer-implemented systems and methods for generating a multiple patterning lithography (MPL) compliant integrated circuit layout are provided. A plurality of integrated circuit (IC) cells are assembled to form an IC layout. The IC layout includes at least two IC cells that abut one another. After the assembling of the IC cells, a decomposition algorithm is executed to assign multiple colors to design shapes within the IC layout. Multiple patterning coloring conflicts are detected in the IC layout after the assigning of the colors to the design shapes. A fixing algorithm is executed, under which a conflict present in two abutting IC cells is fixed by flipping or shifting at least one of the abutting IC cells.

18 Claims, 12 Drawing Sheets

SYSTEMS AND METHODS FOR GENERATING A MULTIPLE PATTERNING LITHOGRAPHY COMPLIANT INTEGRATED CIRCUIT LAYOUT

BACKGROUND

The semiconductor industry has continually improved the speed and power of integrated circuits (ICs) by reducing the size of components within the ICs. In large part, the ability to scale the size of components within an integrated chip is driven by lithographic resolution. However, in recent years, tool vendors have been unable to decrease the wavelength of photolithography exposure tools (e.g., to successfully implement extreme ultraviolet (EUV) lithography, etc.), so that developing technology nodes often have minimum feature sizes less than the wavelength of illumination used in the photolithography tools. To continue scaling, IC fabrication processes use techniques (e.g., immersion lithography, dual tone resist, etc.) that improve the resolution of existing photolithography tools in a manner that extends their usefulness.

Multiple patterning lithography (MPL) is one photolithography technique that is used in advanced technology nodes to decrease the minimum spacing between shapes. To perform MPL, an IC layout is decomposed according to an algorithm that assigns different "colors" to design shapes separated by a space less than a printable threshold. The different colors correspond to different photomasks, such that features of a same color are formed on a same mask of a multiple mask set. By separating IC layout data onto different masks, design shapes can be separated by spaces below a printable threshold since the features comprised within separate masks do not violate the printable threshold.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Integrated circuits (ICs) are often generated by assembling a plurality of individually designed IC cells respectively comprising a plurality of design shapes. To increase the density of an integrated circuit, the IC cells may comprise a plurality of design shapes separated by a minimum allowed space. However, as the size of integrated circuits has continued to scale, photolithography tools have been unable to print design shapes at a minimum allowed space using a single photomask. Therefore, multiple patterning lithography (MPL) (e.g., double patterning lithography, triple patterning lithography, etc.) has become a commonly used technique to achieve minimum allowed spaces (i.e., G0-spaces) smaller than that achievable using a single photomask. MPL uses a decomposition algorithm to assign different "colors" to design shapes within an IC cell, such that adjacent design shapes separated by a sub G0-space are assigned different colors. Shapes having a same color are subsequently formed on a same photomask, thereby preventing design shapes separated by a sub G0-space from being placed on a same mask. An MPL coloring conflict occurs when two shapes having a same color (i.e., two shapes in a same photomask) are spaced apart by less than a predetermined distance.

The approaches of the instant disclosure are directed to computer-implemented systems and methods for generating integrated circuit layouts that do not include MPL coloring conflicts. Such layouts are referred to herein as "MPL-compliant integrated circuit layouts." As described in further detail below, after assembling a plurality of IC cells into an IC layout (which may be referred to as an "assembly" or "placement" procedure), a decomposition algorithm is executed to assign multiple colors (e.g., three or more colors) to design shapes within the IC layout. After the execution of the decomposition algorithm, conflicts in the IC layout are fixed using a variety of techniques. In embodiments, a color swapping algorithm is performed to fix one or more coloring conflicts. Examples of the color swapping algorithm are described in detail below. Following the color swapping algorithm, conflicts that remain are fixed via an algorithm that performs various operations (e.g., one or more of flipping, shifting, swapping, pushing, etc.) on IC cells. Under the approaches of the instant disclosure, coloring conflicts are fixed in a manner that has no design area impact (i.e., a size or area of the IC layout is not increased by the fixing of the conflicts) or minimal design area impact.

Figure 1A:
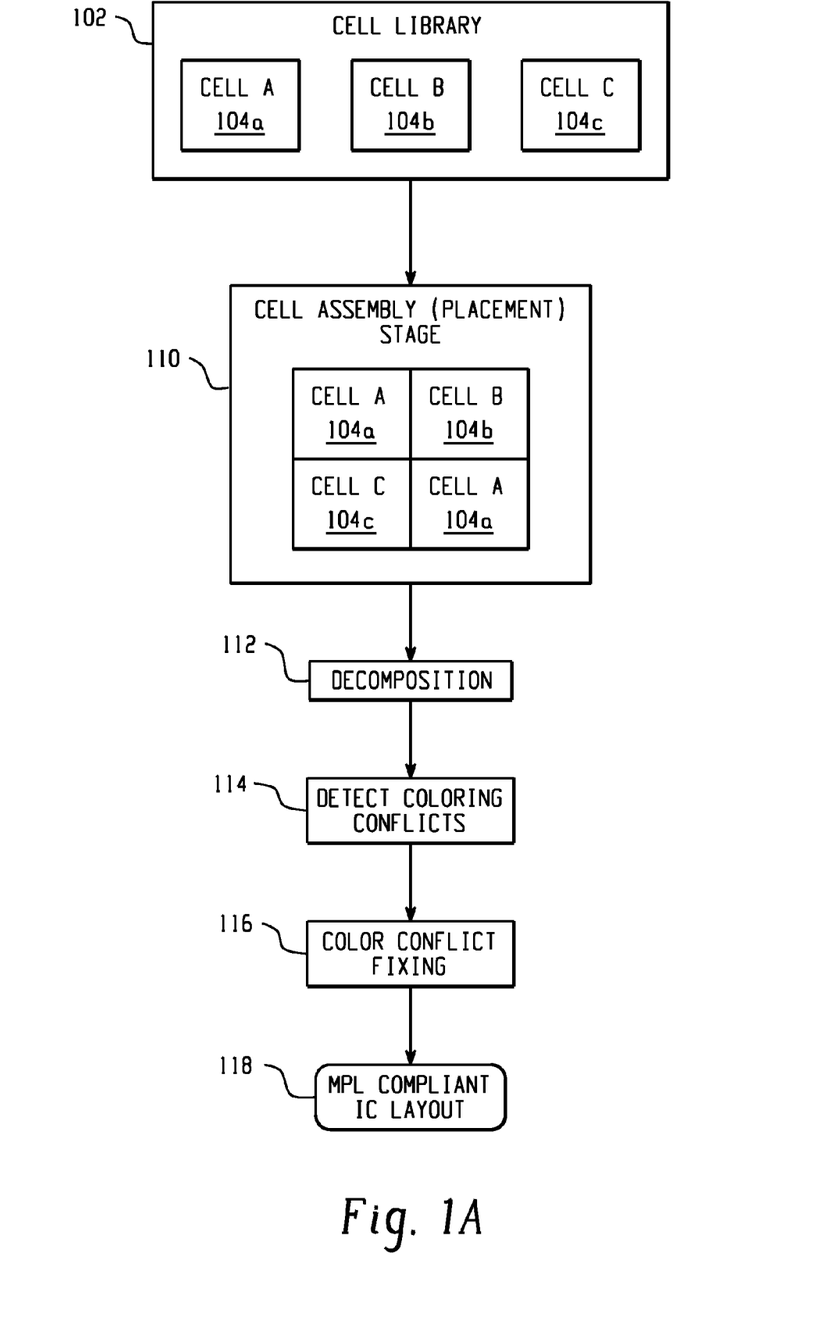
FIG. 1A depicts some embodiments of a flow diagram including steps for generating a multiple patterning lithography (MPL) compliant integrated circuit (IC) layout, in accordance with some embodiments.

FIG. 1 depicts some embodiments of a flow diagram including steps for generating a multiple patterning lithography (MPL) compliant integrated circuit (IC) layout, in accordance with some embodiments. In examples, a cell library 102 includes a plurality of IC cells 104a-104c having a multiple patterning design layer. Respective IC cells comprise a group of semiconductor devices that provide a logic function (e.g., AND, OR, inverter, etc.) or a storage function (e.g., a flip-flop or latch), for example. The multiple patterning design layer comprises a design layer that is to be formed using a multiple patterning lithography approach (e.g., triple patterning lithography, quad patterning lithography, etc.). The multiple patterning design layer comprises design shapes that are separated by spaces that are smaller than a space that can be printed using a single photomask, also known as a "G0-space."

In a cell assembly (i.e., placement) stage 110, the IC cells 104a-104c are assembled to form an IC layout. In the cell assembly stage 110, IC cells are brought into contact with each other so that a cell boundary of a first IC cell abuts (i.e., adjoins) a cell boundary of an adjacent, second IC cell. In embodiments, the IC cells are assembled into one or more rows that abut one another, with each row including one or more IC cells. In embodiments, the IC cells of the cell library 102 are not colored prior to the cell assembly stage 110. This is because it is difficult to color cells prior to assembly in a manner that minimizes color conflicts in the resulting IC layout. Thus, in embodiments described herein, design shapes of the IC cells are colored after the assembly stage 110, and any conflicts resulting from the assembly are fixed using one or more techniques (e.g., color swapping, cell flipping, cell shifting, etc.).

After the assembling of the IC cells into an IC layout in the step 110, a decomposition algorithm is executed at 112 to assign multiple colors (e.g., three or more colors) to the design shapes within the IC layout. In embodiments, the decomposition algorithm executed at 112 is a heuristic algorithm under which (i) shapes that should be assigned a same color are colored first, and (ii) then remaining, uncolored shapes are colored using a greedy coloring scheme. In some embodiments, the decomposition algorithm assigns colors in a manner that attempts to minimize a number of coloring conflicts present in the IC layout. An example decomposition algorithm is described in further detail below.

Figure 1B:
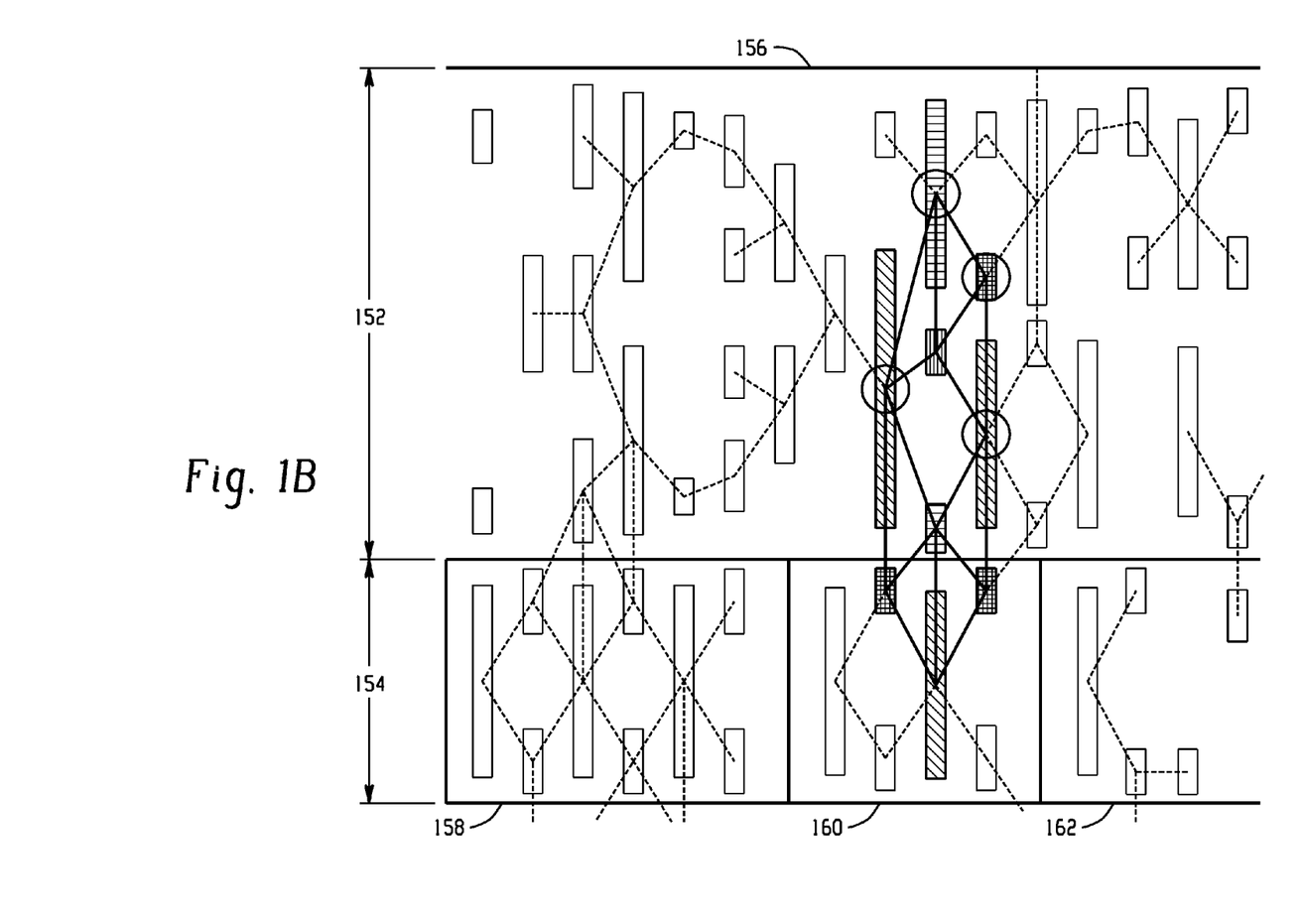
FIG. 1B depicts an example cross-row conflict an IC layout, in accordance with some embodiments.

After the coloring of the design shapes at the step 112, coloring conflicts may be present in the IC layout. Accordingly, at a subsequent step 114, MPL coloring conflicts are detected in the IC layout. When IC cells are placed side-by-side in the cell assembly stage 110, coloring conflicts between adjacent IC cells that abut one another are common. Although coloring conflicts between IC cells of a same row may be relatively easy to fix (e.g., by inserting spacing into two neighboring cells), it may be relatively difficult to fix coloring conflicts between IC cells in different rows. To illustrate an example coloring conflict between IC cells in different rows, reference is made to FIG. 1B. This figure depicts an IC layout including first and second rows 152, 154. The first row 152 includes an IC cell 156, and the second row 154 includes several IC cells 158, 160, 162. In this example, a coloring conflict exists between the IC cell 156 of the first row 152 and the IC cell 160 of the second row 154. The coloring conflict arises due to an interaction of design shapes within the respective IC cells 156, 160.

At a step 116, one or more techniques are employed to fix (i.e., remove, eliminate, etc.) the detected coloring conflicts. In embodiments, a color swapping algorithm is performed to fix one or more coloring conflicts. In the color swapping algorithm, color assignments of neighboring design shapes are exchanged (i.e., swapped) in a manner that fixes one or more of the coloring conflicts. Following the color swapping algorithm, conflicts that remain are fixed via an algorithm that performs various operations on IC cells. For instance, in embodiments, when a conflict is present in two IC cells that abut one another in the IC layout, the conflict is fixed by flipping or shifting at least one of the abutting IC cells. In other embodiments, other manipulation of IC cells (e.g., swapping IC cells, etc.) is performed to fix remaining conflicts. Under the approaches of the instant disclosure, coloring conflicts are fixed in a manner that has no design area impact (i.e., a size or area of the IC layout is not increased by the fixing of the conflicts) or minimal design area impact. After the fixing of the color conflicts at the step 116, a resulting IC layout 118 does not include coloring conflicts. The layout 118 may thus be referred to as an "MPL-compliant" IC layout.

The approaches of the instant application differ from conventional approaches. In some conventional approaches, "design rules" are used for the purpose of developing IC cells that will not have conflicts when assembled into an IC layout. However, even despite these design rules, it is difficult to guarantee that conflicts will not occur after the assembly stage (i.e., placement stage). If a conflict does result, in some conventional approaches, sizes of one or more design shapes are reduced, which is undesirable (e.g., shrinking design shapes may present electromagnetic issues, yield issues, etc.). Further, the design rules may be seen as "overkill" to some users (e.g., there may be many design rules, and complying with all of the design rules may be burdensome for users, etc.). In other conventional approaches, coloring conflicts are avoided or fixed in a way that increases a cell area and/or an area of the IC layout. It is generally undesirable to enlarge a size of a cell or IC layout.

In contrast to the conventional approaches, under the approaches of the instant disclosure, the above-described design rules are not utilized. Thus, users are not burdened with a large number of design rules that may be difficult to implement and that may not guarantee a colorable IC layout. Additionally, under the approaches of the instant disclosure, when coloring conflicts are detected, such conflicts are fixed in a manner that does not require shrinking sizes of design shapes, in contrast to some of the conventional approaches described above. Further, under the approaches of the instant disclosure, coloring conflicts are fixed in a manner that has no design area impact or only minimal design area impact.

Embodiments of the instant disclosure utilize graph theory in the analysis and validation of MPL decompositions. A given IC layout can be represented as a conflict graph $CG=(V,E)$, where each vertex V represents a design shape of the layout, and an edge E is formed connecting two vertices when the distance between two corresponding design shapes is less than a minimum separation distance for clearly exposed patterns using a single photomask. Conflict graphs can be used in decomposing layouts into separate masks for multiple patterning lithography, or in verifying that a set of masks is properly decomposed, such that no two design shapes in the same mask are spaced apart by less than the predetermined minimum separation distance. A coloring conflict (i.e., a decomposition violation) occurs when two vertices connected by a common edge are assigned to the same mask. Uses of conflict graphs in the approaches of the instant disclosure are described in further detail below.

Figure 1C:
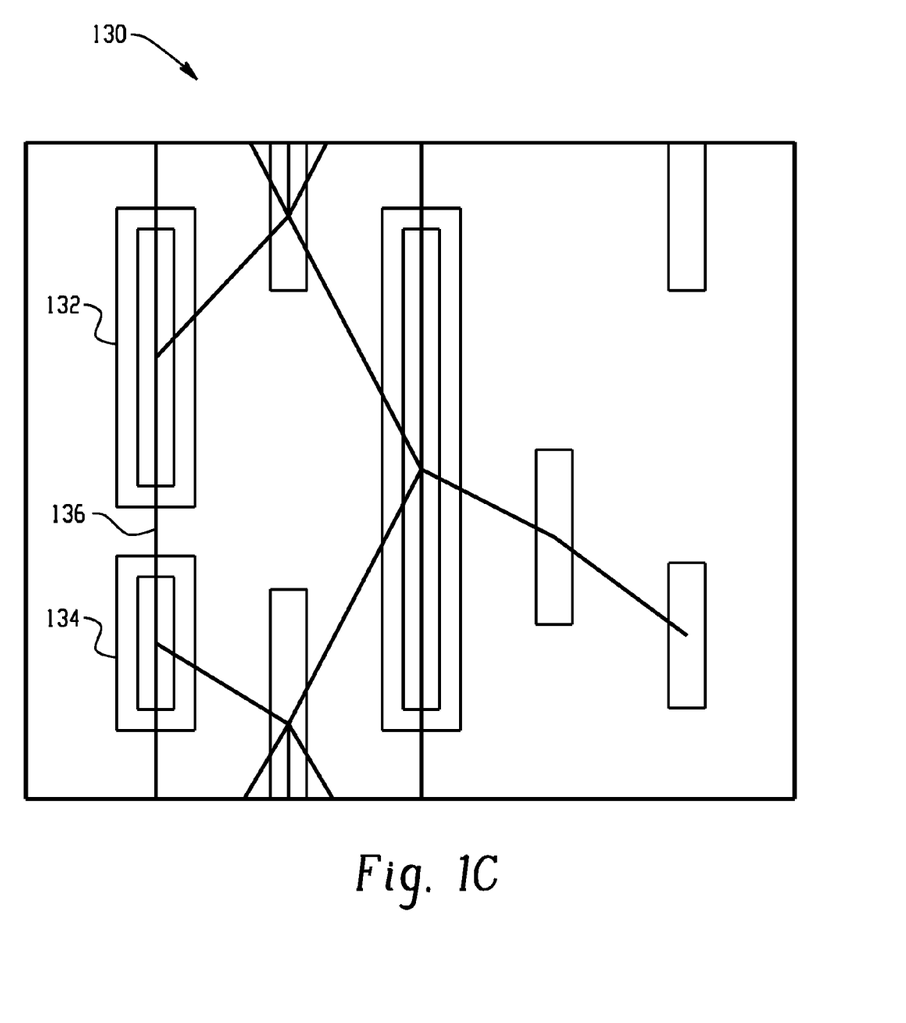
FIG. 1C depicts an example IC cell, in accordance with some embodiments.

In embodiments, the IC cells 104a-104c of the library 102 are "MPL-friendly" cells, each of which is designed to reduce color conflicts that can occur when the IC cell is assembled into an IC layout with other IC cells. Thus, in embodiments, design guidelines are introduced to ensure that the IC cells of the library 102 are MPL-friendly. One example design guideline is described with reference to the IC cell 130 of FIG. 1C. In the example design guideline, two shapes forming a path going through the cell in a conflict graph should not be created because such a layout pattern commonly induces conflicts. In the IC cell 130 of FIG. 1C, the design shapes 132, 134 violate this guideline, and this violation could be prevented if there was no edge 136 between the two shapes 132, 134. In embodiments, this design guideline and/or other design guidelines are soft constraints. For instance, a design guideline need not be adhered to if it would result in an increase in cell area. Thus, under the approaches of the instant disclosure, it is recognized that color conflicts may be present in the IC layout after assembly, despite the use of MPL-friendly cells. Such color conflicts are fixed after the placement stage using the techniques described herein.

As described above with reference to FIG. 1A, after the assembling of the IC cells into an IC layout, a decomposition algorithm is executed to assign multiple colors (e.g., three or more colors) to the design shapes within the IC layout. In embodiments, prior to executing the decomposition algorithm, a conflict graph is generated from the IC layout. Subsequently, in executing the decomposition algorithm, (i) vertices of the conflict graph that should be assigned a same color to avoid conflicts are colored first, and (ii) then remaining, uncolored vertices are colored using a greedy coloring scheme.

Figure 2A:
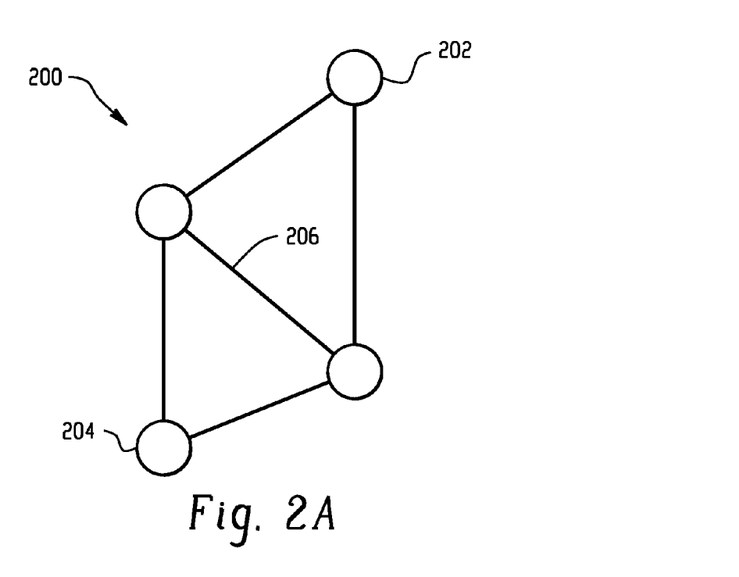
FIG. 2A depicts a kite of a conflict graph, in accordance with some embodiments.
Figure 2B:
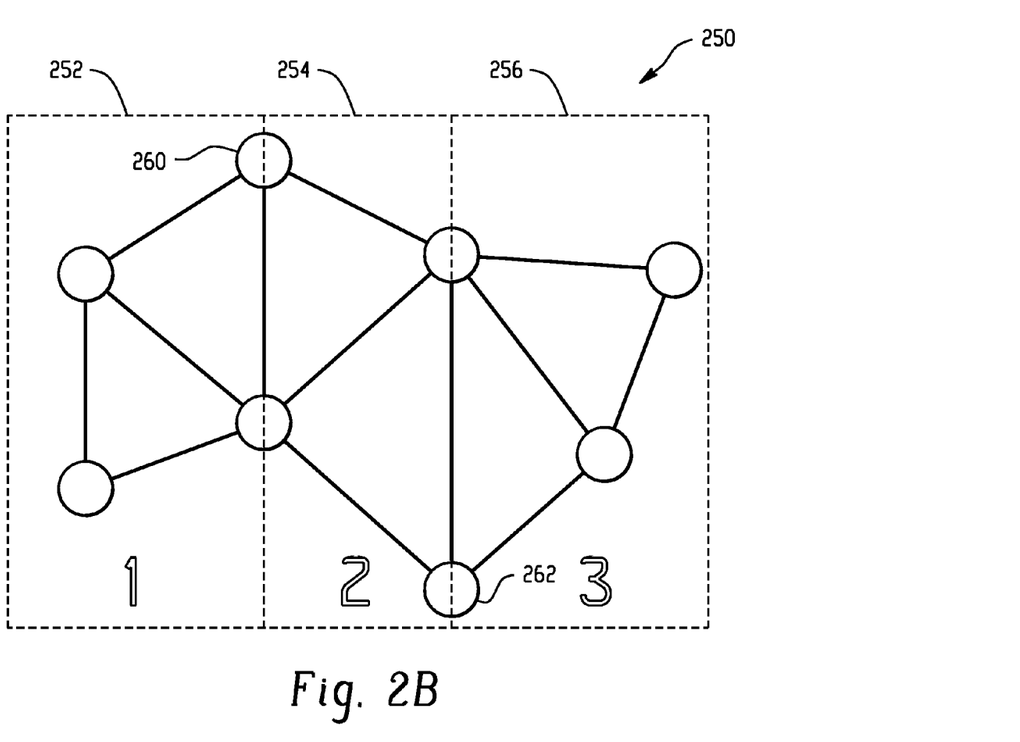
FIG. 2B depicts a kite list of a conflict graph, in accordance with some embodiments.

In embodiments, the vertices of the conflict graph that should be assigned a same color are end vertices of "kite lists" detected in the conflict graph. As referred to herein, a "kite" is a graph comprising two triangles sharing one common edge. The two vertices not on the common edge are referred to as "end vertices" of the kite. To illustrate an example kite, reference is made to FIG. 2A. This figure depicts a kite 200 including two triangles with a common edge 206. The two vertices 202, 204 not on the common edge 206 are end vertices of the kite 200. As referred to herein, a "kite list" is a list of kites that are connected through common end vertices. To illustrate an example kite list, reference is made to FIG. 2B. This figure depicts a kite list 250 including kites 252, 254, 256 connected through common end vertices 260, 262.

Because end vertices of a kite have edges to two common connected neighbors, such end vertices should be assigned a same color. Otherwise, there will likely be a color conflict. Because end vertices of a kite should have a same color, all end vertices in a kite list should have a same color. Accordingly, under the approaches of the instant disclosure, a kite list detection algorithm is used to automatically detect kite lists in a conflict graph corresponding to an IC layout. This enables the automatic collection of sets of end vertices of all kite lists in the conflict graph, such that each set of end vertices can be assigned a same color.

An example kite list detection algorithm is as follows:

```
Input: A conflict graph G(V,E).
Output: KiteLists, { end vertex set of each kite list }
    for each unvisited v ∈ V do
        List <-- ∅
        Insert v into list
        Mark v as visited
        SearchKite(v, list)
        if | list | > 1 do
            Insert list into KiteLists
        end if
    end for
function SearchKite(v, list) do
    for each edge pair ((v, v_i), (v, v_j)) such that
        (v, v_i), (v, v_j) ∈ E and (v_i, v_j) ∈ E do
        for each v_k ∈ V such that
            (v_i, v_k), (v_j, v_k) ∈ E and v_k is unvisited do
            Mark as v_k visited
            Insert v_k into list
            SearchKite (v_k, list)
        end for
    end for
end function
```

In the example kite list detection algorithm above, the algorithm first checks if the vertex belongs to a triangle. In other words, the algorithm checks if there is any edge between two neighbors of the vertex. If such an edge is found, the algorithm detects whether there exists another triangle that shares the edge. If another triangle is found, a kite is detected. Next, starting from the other end vertex of the kite, the algorithm recursively searches subsequent kites. The complexity of the algorithm is O(n), where n is the number of vertices in the input conflict graph. Each vertex is detected once when checking if it is an end vertex of a kite. In steps of the above algorithm, each neighboring pair of a visiting vertex is checked. Those steps take constant time because a vertex has a constant upper bound of neighbors in a real layout.

Figure 3A:
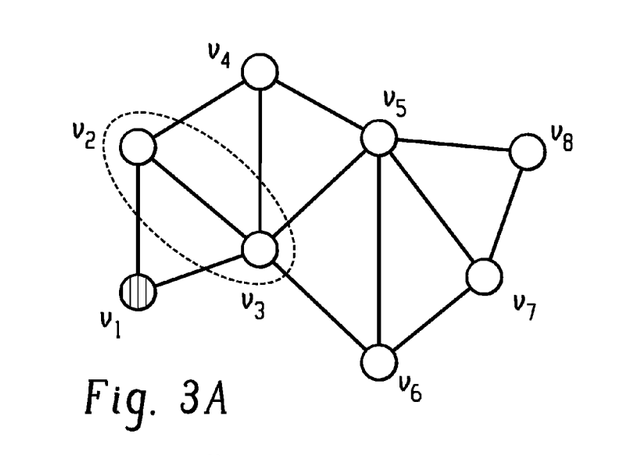
FIGS. 3A-3D depict operations of an example execution of a kite list detection algorithm, in accordance with some embodiments.
Figure 3B:
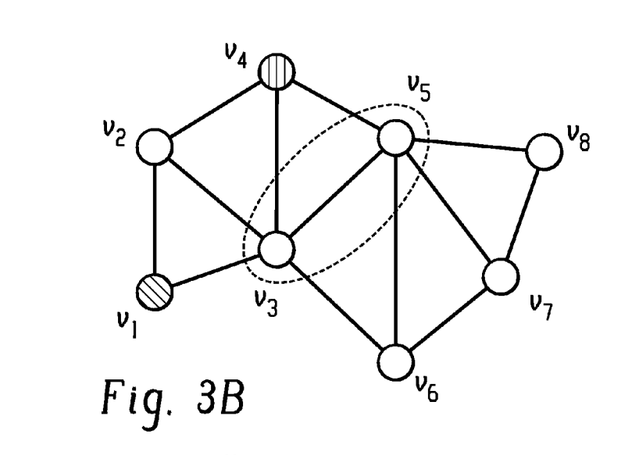
Figure 3C:
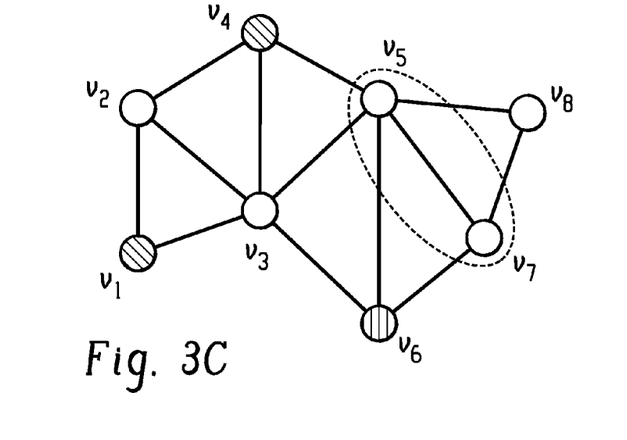
Figure 3D:
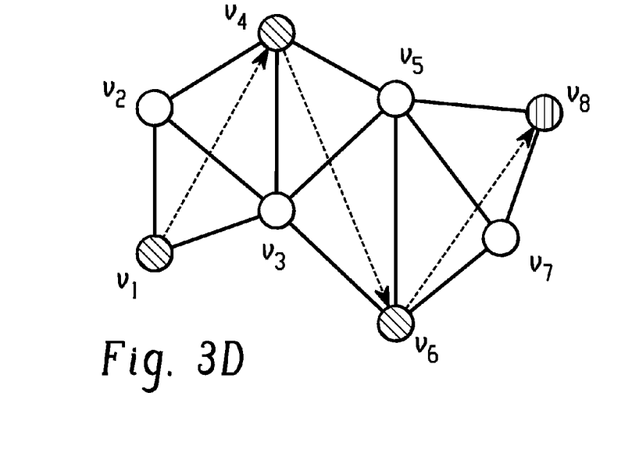

FIGS. 3A-3D illustrate an example execution of the kite list detection algorithm. Beginning with vertex $v_1$, edge ($v_2$, $v_3$) is detected, as shown in FIG. 3A. Then, another triangle composed of $v_2$, $v_3$, and $v_4$ is found, and thus, a kite is found. Next, starting from $v_4$, the other end vertex of the kite, the same steps are performed, and as a result, another kite composed of $v_3$, $v_4$, $v_5$, and $v_6$ is detected, as shown in FIG. 3B. Likewise, in FIG. 3C, the kite composed of $v_5$, $v_6$, $v_7$, and $v_8$ is found. FIG. 4D shows that four end vertices, $v_1$, $v_4$, $v_6$, and $v_8$, are inserted into the list in turn after applying the algorithm from $v_1$.

After identifying the sets of end vertices of all kite lists in the input conflict graph via the kite list detection algorithm, the decomposition algorithm can be executed to assign multiple colors (e.g., three or more colors) to design shapes within the IC layout. In an example decomposition algorithm, (i) a same color is assigned to end vertices of each detected kite list, and (ii) then a greedy coloring method is applied on each un-colored vertex. An example decomposition algorithm is as follows:

```
Input: A conflict graph G(V,E).
Output: Each v ∈ V is assigned a non-conflicted color
        ∈ {c_1, c_2, c_3} if there is one
KiteLists <--- Detect all kite lists in G by Algorithm 1
for each list ∈ KiteLists do
    Assign the first legal color ∈ {c_1, c_2, c_3} for all
        end vertices if there is one
```

-continued

```
    end for
    Sort all uncolored vertices according to the edge count
    for each uncolored v ∈ V do
        Assign the first legal color ∈ {c_1, c_2, c_3} to v if there is one
    end for
```

In the example decomposition algorithm above, the complexity of the algorithm is O(n). Additionally, an O(n) sorting algorithm, such as bucket sorting, can be used in performing the step "Sort all uncolored vertices according to the edge count." As a consequence, the algorithm keeps O(n) complexity.

As described above with reference to FIG. 1A, after assigning colors to design shapes of the IC layout via the decomposition algorithm, conflicts are detected (e.g., at the step 114) and subsequently fixed (e.g., at the step 116). In examples, the fixing of color conflicts utilizes two techniques. A first fixing technique uses a color swapping algorithm to fix conflicts by recursively swapping color with neighboring vertices. A second fixing technique fixes remaining conflicts by manipulating (e.g., flipping, shifting, etc.) IC cells of the IC layout. The first and second fixing techniques are described in turn below.

The example decomposition algorithm described above follows a certain order to color vertices. In embodiments, the example color swapping algorithm described herein is used to fix conflicts caused by the order issue. An uncolored vertex of the input conflict graph after the decomposition algorithm means that the vertex has a color conflict. From such a vertex, the color swapping algorithm swaps the vertex with all its neighbors of color $c_i \epsilon \{c_1, c_2, c_3\}$ in turn when searching for a legal color assignment. Next, in the color swapping algorithm, starting from each neighbor of color $c_i$ the same step is repeatedly performed until a legal assignment is found or all vertices are visited.

Figure 4A:
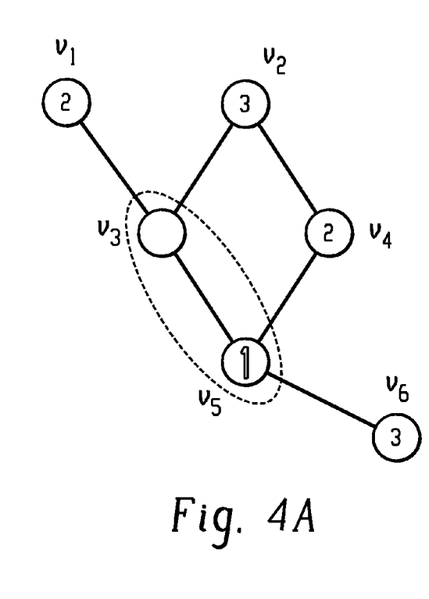
FIGS. 4A-4C depict operations of an example execution of a color swapping algorithm, in accordance with some embodiments.
Figure 4B:
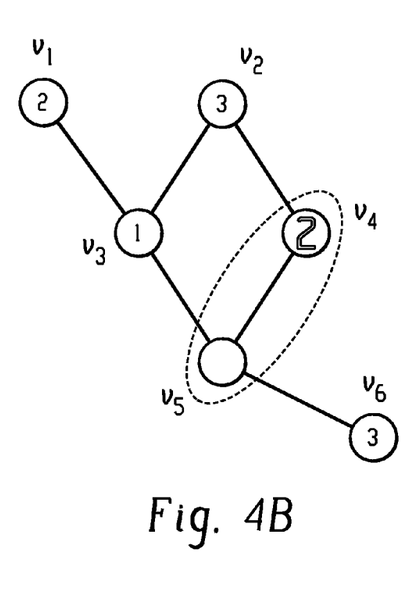
Figure 4C:
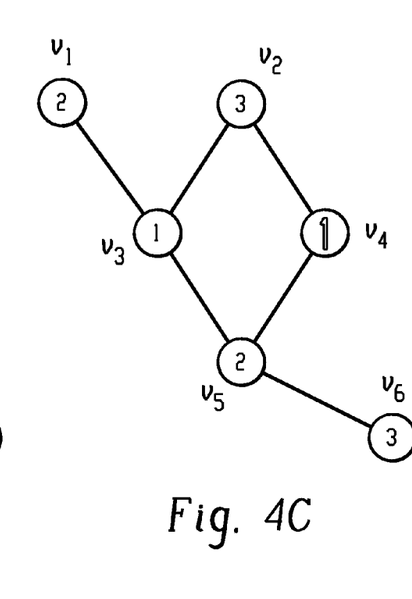

FIGS. 4A-4C depict operations of an example execution of the color swapping algorithm, in accordance with some embodiments. From $v_3$, neighboring vertices with color $c_1$ are swapped first. In FIG. 4A, $v_5$'s color, $c_1$, is swapped to $v_3$. After swapping, $v_5$ still has no legal color to be assigned. Thus, the swapping step is performed from $v_5$, and the color swapping algorithm tries to swap its unvisited neighbors of $c_1$. No such neighbor is found in this example. Thus, the color swapping algorithm tries to swap vertices with $c_2$ instead. In FIG. 4B, $v_4$ is found and its color is swapped to $v_5$. For $v_4$, it can be colored as $c_1$ without any conflict, as FIG. 4C shows. Thus, a conflict is fixed using the color swapping algorithm.

After executing the color swapping algorithm, one or more additional algorithms are executed to fix remaining conflicts. Specifically, in embodiments, after the color swapping algorithm is executed, a color fixing algorithm that utilizes cell flipping and/or cell shifting is performed to modify the conflict graph and then recolor the conflict graph. In embodiments, the color fixing algorithm first detects sub-graphs of the conflict graph that have no legal assignments. Next, in the color fixing algorithm, kite lists that have no solutions are detected, and then IC cells in the kite list are flipped or shifted to fix conflicts.

Figure 5A:
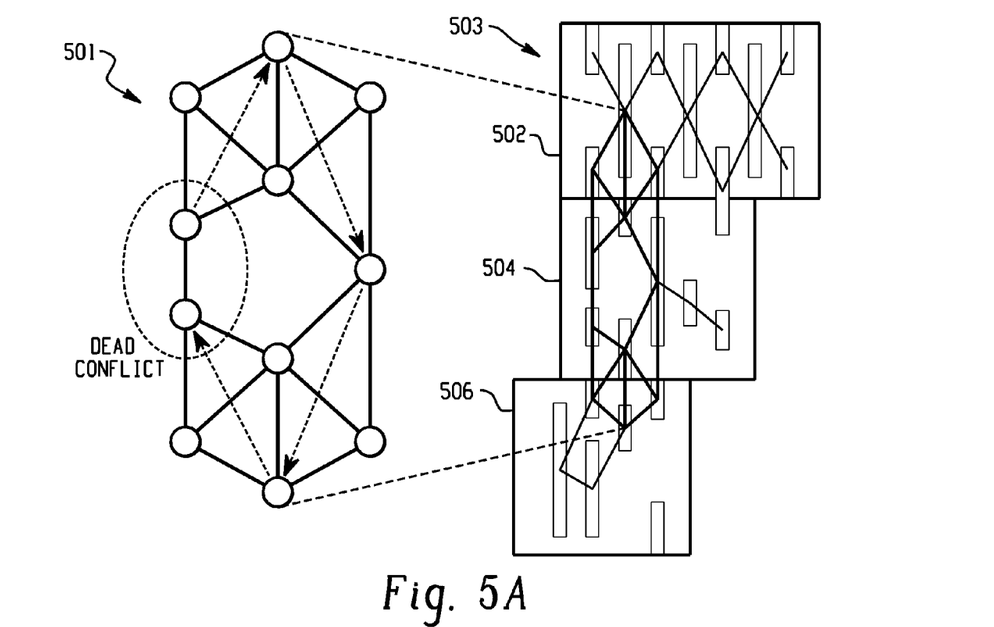
FIG. 5A depicts a dead kite list and a partial design including the dead kite list, in accordance with some embodiments.

In examples, most color conflicts are caused by "dead kite lists." A kite list is a dead kite list if two end vertices have an edge. A dead kite list has no legal coloring solution. As noted above, all end vertices of a kite list should have a same color. Thus, a conflict occurs between end vertices that have an edge. FIG. 5A depicts a conflict graph 501 including a dead kite list and shows the edge between two end vertices that should be broken to fix the conflict. FIG. 5A also depicts IC cells 502, 504, 506 of an IC layout 503 that corresponds to the conflict graph 501. The IC layout 503 comprises a portion of a larger IC layout, in examples.

In the color fixing algorithm, dead kite lists are detected and then the IC cell in which a conflict is located is flipped. In embodiments, flipping the IC cell does not cause a position of the IC cell to change, and the flipped IC cell comprises a mirror image of the unflipped IC cell. To illustrate an example flipping performed by the color fixing algorithm, reference is made to FIG. 5B. As shown in this figure, the IC cell 504 is flipped, such that the flipped IC cell 504 is a mirror image of the unflipped IC cell 504 (i.e., as shown in FIG. 5A). The position of the IC cell 504 is not changed by the flipping. After the flipping of the IC cell according to the color fixing algorithm, a decomposition algorithm is executed to check whether the conflict is solved.

Figure 5B:
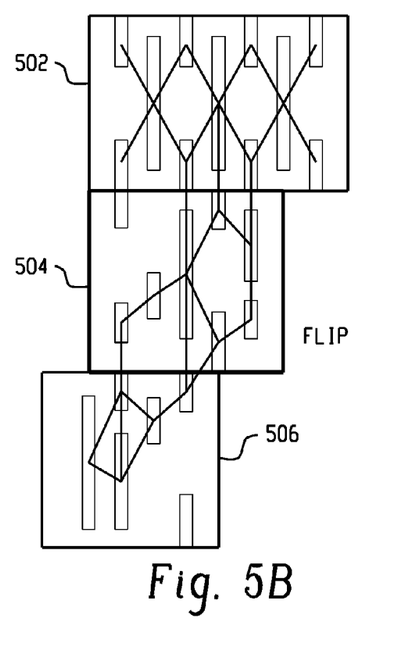
FIG. 5B depicts the use of cell flipping to fix a coloring conflict, in accordance with some embodiments.
Figure 5C:
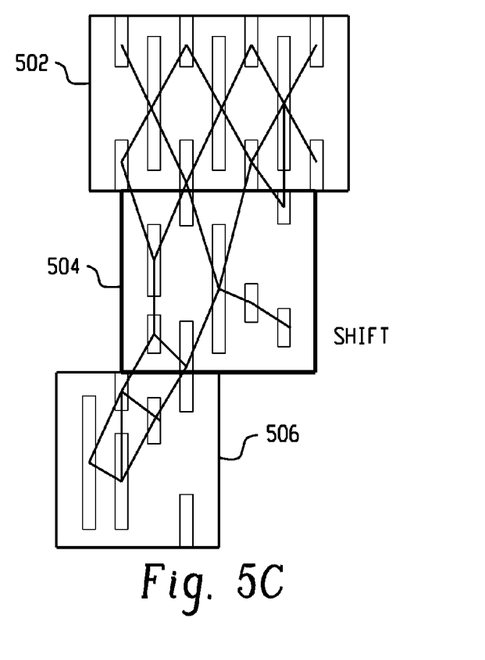
FIG. 5C depicts the use of cell shifting to fix a coloring conflict, in accordance with some embodiments.

In embodiments, if the conflict remains after the flipping, the IC cell is continuously shifted until the conflict is fixed. To illustrate an example shifting performed by the color fixing algorithm, reference is made to FIG. 5C. As shown in this figure, the IC cell 504 is shifted in position to the right. In the example of FIGS. 5A-5C, the conflict can be fixed by cell flipping or cell shifting. However, because cell flipping does not cause a position of the IC cell to change, flipping is preferred over shifting in order to minimize total cell displacement. Thus, in examples, cell shifting is only performed if it is determined that a conflict remains after cell flipping. In embodiments of the color fixing algorithm, for conflicts that do not belong to a dead kite list, cell flipping and shifting are also applied at the cells where those conflicts are.

Figure 5D:
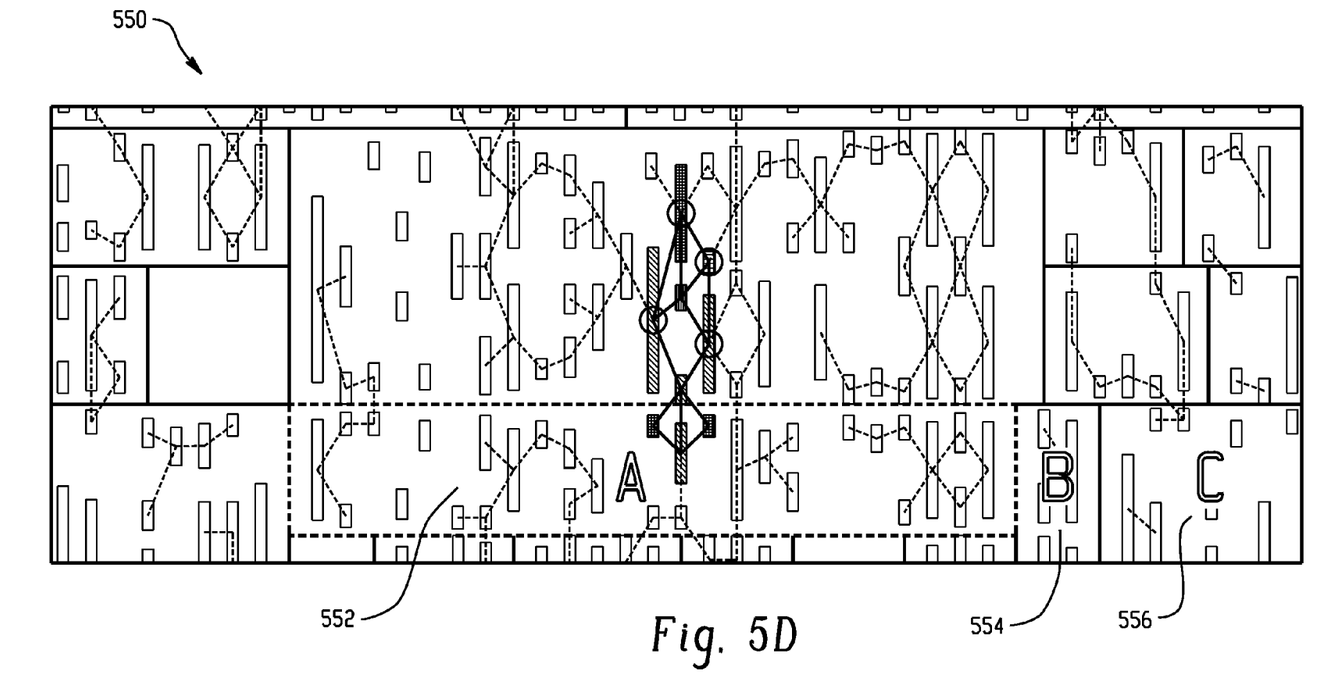
FIGS. 5D and 5E depict the use of cell pushing to fix a coloring conflict, in accordance with some embodiments.
Figure 5E:
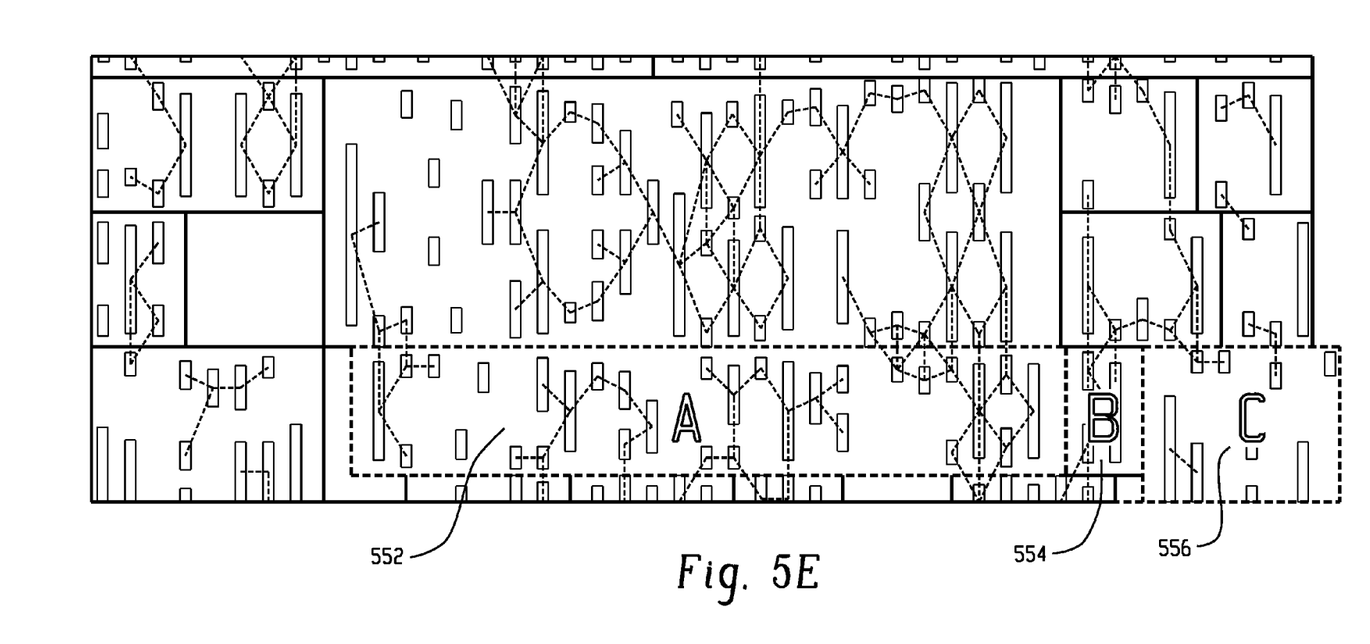

In embodiments, a "pushing" technique is used to fix conflicts. To illustrate an example of the pushing technique performed by the color fixing algorithm, reference is made to FIGS. 5D and 5E. FIG. 5D depicts IC cells 552, 554, 556 of an IC layout 550 that includes one or more conflicts. In using the pushing technique to fix the one or more conflicts, the IC cells 552, 554, 556 are all shifted in position to the right, as shown in FIG. 5E. By moving the IC cells 552, 554, 556 in this manner, this corrects the one or more conflicts. The pushing technique varies from the above-described "shifting" technique because in the shifting technique, an IC cell is shifted in position without changing positions of neighboring IC cells. By contrast, in the pushing technique, multiple IC cells are shifted in position (e.g., the movement of one IC cell "pushes" into a neighboring IC cell, thus requiring both of the IC cells to be moved).

Figure 6:
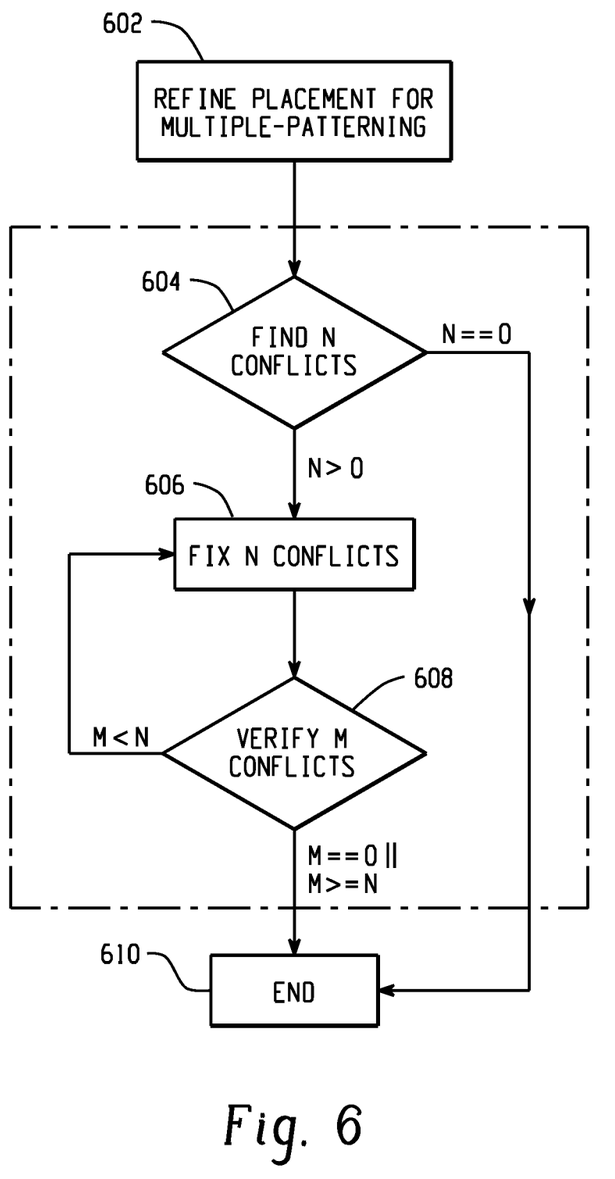
FIG. 6 is a flowchart depicting operations of an example method for generating an MPL-compliant IC layout, in accordance with some embodiments.

FIG. 6 is a flowchart depicting operations of an example method for generating an MPL-compliant IC layout, in accordance with some embodiments. At a step 602, IC cells are assembled (e.g., placed via a placement procedure) into an IC layout including at least two IC cells that abut one another. In examples, a conflict graph is generated from the IC layout, and one or more of the steps described below with reference to FIG. 6 (e.g., coloring algorithm, decomposition algorithm for detecting conflicts, color swapping algorithm, etc.) are performed based on the conflict graph. Further, at the step 602, a coloring algorithm is applied to assign colors to design shapes of the layout, as described above. Optionally, at the step 602, a color swapping algorithm is executed, under which color assignments of neighboring design shapes are exchanged in a manner that fixes one or more coloring conflicts in the IC layout.

At a step 604, a decomposition algorithm is executed to detect N coloring conflicts in the IC layout. If N is equal to zero, then the flowchart ends at 610. If N is greater than 0, then the flowchart proceeds to a step 606, during which an attempt is made to fix the N conflicts. As described above, in examples, conflict cells are detected from the conflict graph, and cells are flipped or shifted in order to fix conflicts. Further, in embodiments, additional other cell manipulation techniques are utilized. For instance, in some embodiments, IC cells are "swapped" with one another to fix conflicts and/or IC cells are "pushed" into one another to fix conflicts. While the flipping, shifting, and swapping of IC cells can typically be performed without enlarging the design area, the pushing of IC cells may result in an enlargement of the design area. The enlargement of the design area may be undesirable, and thus, the pushing technique is not utilized in some embodiments.

At a step 608, a number of conflicts M still present in the IC layout is detected. If M is less than N, then the flowchart returns to the step 606, during which an attempt is made to fix the remaining conflicts. If M is equal to zero or M is greater than or equal to N, then the flowchart ends at 610 and no further conflict fixing is performed. It is thus noted that conflict fixing is performed until all conflicts have been fixed or until a number of detected conflicts (i.e., M) is greater than or equal to a number of conflicts previously detected (i.e., N).

Figure 7:
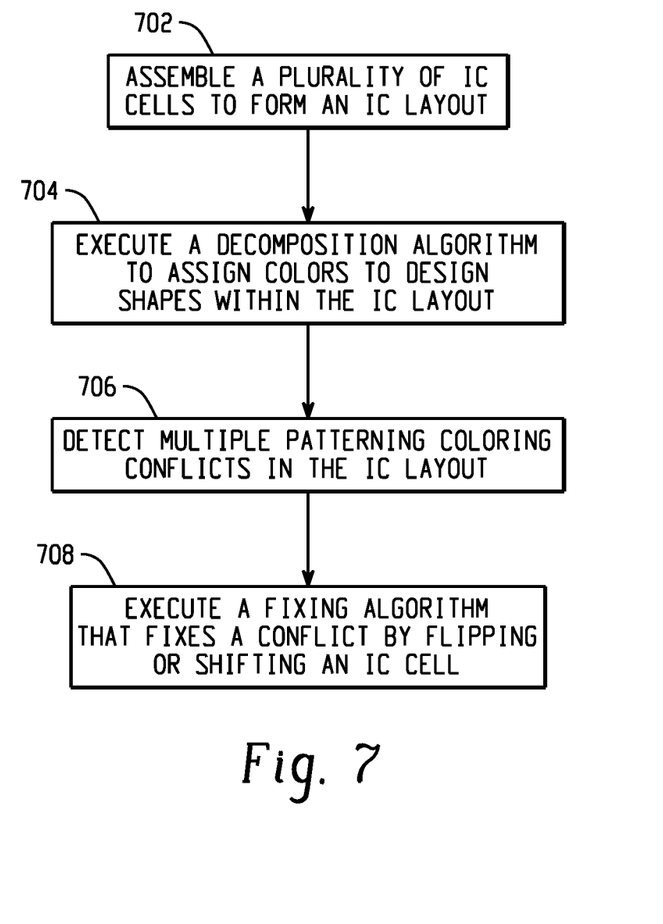
FIG. 7 is a flowchart depicting operations of an example method for generating an MPL-compliant IC layout, in accordance with some embodiments.

FIG. 7 is a flowchart depicting operations of an example method for generating an MPL-compliant IC layout, in accordance with some embodiments. At 702, a plurality of integrated circuit (IC) cells are assembled, using a processing system, to form an IC layout. The IC layout includes at least two IC cells that abut one another. At 704, after the assembling of the IC cells, the processing system is used to execute a decomposition algorithm on the IC layout to assign multiple colors to design shapes within the IC layout. At 706, the processing system is used to detect multiple patterning coloring conflicts in the IC layout after the assigning of the colors to the design shapes. At 708, the processing system is used to execute a fixing algorithm under which a conflict present in two abutting IC cells is fixed by flipping or shifting at least one of the abutting IC cells.

Figure 8:
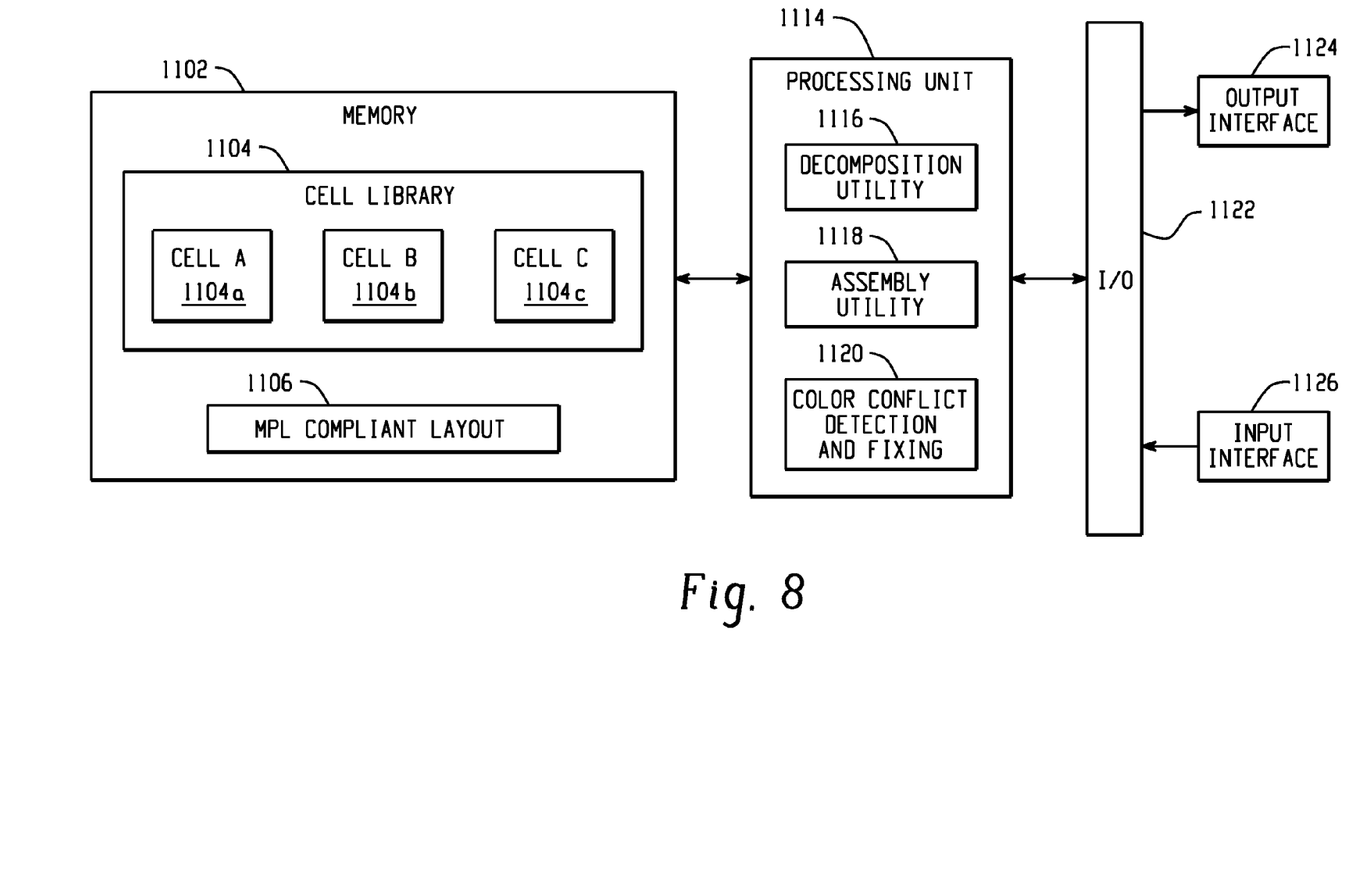
FIG. 8 depicts some embodiments of a computer system configured to perform operations for generating an MPL-compliant IC layout, in accordance with some embodiments.

FIG. 8 depicts some embodiments of a computer system configured to perform operations for generating an MPL-compliant IC layout, in accordance with some embodiments. The computer system includes a memory element 1102 and a processing unit 1114. Memory element 1102 is configured to store a cell library 1104 including a plurality of unassembled IC cells 1104a-1104c, an MPL compliant IC layout 1106, and computer readable instructions that provide methods of operating one or more components of the computer system according to one or more of the methods (i.e., algorithms) disclosed herein. For example, the memory element 1102 may store computer executable instructions for implementing a cell assembly (i.e., placement) stage, generating a conflict graph corresponding to an IC layout, implementing a decomposition algorithm (e.g., for assigning multiple colors to design shapes of the IC layout), implementing a detection algorithm for detecting coloring conflicts in the IC layout, implementing a color swapping algorithm, and/or implementing one or more color conflict fixing algorithms, as described herein. In some embodiments, the memory element 1102 comprises a machine readable storage medium.

In embodiments, the plurality of unassembled IC cells 1104a-1104c comprise graphical representations, such as, for example, GDSII files, of a group of semiconductor devices that provide a logic function (e.g., AND, OR, inverter, etc.) or a storage function (e.g., a flip-flop or latch), for example.

The processing unit 1114 is configured to receive the unassembled IC cells 1104a-1104c and the computer readable instructions of the memory 1102 as inputs. The processing unit 1114 is configured to execute the computer readable instructions, such that at times, one or more of a decomposition utility 1116, an assembly utility 1118, and a color conflict detection and fixing utility 1120 are executed by the processing unit 1114. The processing unit 1114 is also configured to execute computer readable instructions for generating a conflict graph and implementing a color swapping algorithm, among other algorithms described herein.

In some embodiments, various outputs are provided by way of an I/O 1122 to an output interface 1124 that allows the processing unit 1114 to exchange information with an external environment. In some embodiments, various inputs are received by way of the I/O 1122 via one input interfaces 1126. Such input interfaces allow, for instance, input to be received from a user.

The use of the techniques described herein improve the functioning of a computer system as compared to conventional approaches for generating an MPL-compliant integrated circuit layout. Specifically, the techniques described herein enable an MPL-compliant integrated circuit layout to be generated in a more efficient manner (e.g., faster and with smaller memory requirements) and with a reduced processing burden as compared to the conventional approaches. Further, in examples, an integrated circuit layout generated using the techniques described herein has a number of color conflicts (e.g., zero conflicts, a non-zero number of conflicts) that is significantly less than that of a corresponding layout generated using conventional approaches. Accordingly, an amount of time, amount of memory, and/or processing burden needed to fix the remaining color conflicts are significantly less for layouts generated according to the techniques described herein, as compared to layouts generated using the conventional approaches.

The present disclosure is directed to systems and methods for generating a multiple patterning lithography (MPL) compliant integrated circuit layout. In an example computer-implemented method for generating an MPL-compliant integrated circuit layout, a plurality of integrated circuit (IC) cells are assembled, using a processing system, to form an IC layout. The IC layout includes at least two IC cells that abut one another. After the assembling of the IC cells, the processing system is used to execute a decomposition algorithm on the IC layout to assign multiple colors to design shapes within the IC layout. The processing system is used to detect multiple patterning coloring conflicts in the IC layout after the assigning of the colors to the design shapes. The processing system is used to execute a fixing algorithm under which a conflict present in two abutting IC cells is fixed by flipping or shifting at least one of the abutting IC cells.

An example computer-implemented system for generating an MPL-compliant integrated circuit layout includes a processing system and a computer-readable memory in communication with the processing system. The computer-readable memory is encoded with instructions for commanding the processing system to execute steps. In executing the steps, a plurality of integrated circuit (IC) cells are assembled to form an IC layout. The IC layout includes at least two IC cells that abut one another. After the assembling of the IC cells, a decomposition algorithm is executed to assign multiple colors to design shapes within the IC layout.

Multiple patterning coloring conflicts are detected in the IC layout after the assigning of the colors to the design shapes. A fixing algorithm is executed, under which a conflict present in two abutting IC cells is fixed by flipping or shifting at least one of the abutting IC cells.

An example non-transitory computer-readable storage medium for generating an MPL-compliant integrated circuit layout includes computer executable instructions which, when executed, cause a processing system to execute steps. In executing the steps, a plurality of integrated circuit (IC) cells are assembled to form an IC layout. The IC layout includes at least two IC cells that abut one another. After the assembling of the IC cells, a decomposition algorithm is executed to assign multiple colors to design shapes within the IC layout. Multiple patterning coloring conflicts are detected in the IC layout after the assigning of the colors to the design shapes. A fixing algorithm is executed, under which a conflict present in two abutting IC cells is fixed by flipping or shifting at least one of the abutting IC cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A computer-implemented method for generating a multiple patterning lithography (MPL) compliant integrated circuit layout, the method comprising:
   assembling, using a processing system, a plurality of integrated circuit (IC) cells to form an IC layout, the IC layout including at least two IC cells that have adjoining cell boundaries;
   after the assembling of the IC cells, using the processing system to execute a decomposition algorithm to assign multiple colors to design shapes within the IC layout;
   detecting, using the processing system, multiple patterning coloring conflicts in the IC layout after the assigning of the colors to the design shapes, wherein a number N of conflicts are detected;
   executing, using the processing system, a fixing algorithm under which a conflict present in two abutting IC cells is fixed by flipping or shifting at least one of the adjoining IC cell;
   determining a number M of conflicts still present in the IC layout;
   re-executing the fixing algorithm based on a determination that M is less than N;
   performing no further conflict fixing based on a determination that (i) M is equal to zero, or (ii) M is greater than or equal to N; and
   using the MPL compliant integrated circuit layout to fabricate an integrated circuit.

2. The computer-implemented method of claim 1, wherein the executing of the fixing algorithm comprises:
   flipping one of the abutting IC cells, a position of the flipped IC cell in the IC layout being unchanged by the flipping;
   determining whether the conflict in the two adjoining IC cells is still present after the flipping;
   based on a determination that the conflict is still present, shifting one of the adjoining IC cells until the conflict is fixed.

3. The computer-implemented method of claim 2, wherein the flipped IC cell comprises a mirror image of the unflipped IC cell.

4. The computer-implemented method of claim 1, further comprising:
   using the processing system to execute a color swapping algorithm under which color assignments of neighboring design shapes are exchanged in a manner that fixes one or more coloring conflicts in the IC layout.

5. The computer-implemented method of claim 4, wherein the execution of the color swapping algorithm comprises:
   generating a conflict graph from the IC layout, wherein the conflict graph includes (i) vertices representing design shapes of the IC layout, and (ii) edges that connect two vertices when a distance between the corresponding design shapes is less than a minimum separation distance; and
   identifying a first vertex corresponding to a design shape of the IC layout that has not yet been assigned a color;
   identifying a second vertex connected to the first vertex via an edge, the second vertex corresponding to a design shape in the IC layout that has been assigned a first color; and
   exchanging the color assignments of the first and second vertices such that the first vertex is assigned the first color and the second vertex is uncolored.

6. The computer-implemented method of claim 1, wherein the plurality of IC cells have a multiple patterning design layer including design shapes that are assigned three different colors during the execution of the decomposition algorithm.

7. The computer-implemented method of claim 1, wherein the executing of the decomposition algorithm comprises:
   generating a conflict graph from the IC layout, wherein the conflict graph includes (i) vertices representing design shapes of the IC layout, and (ii) edges that connect two vertices when a distance between the corresponding design shapes is less than a minimum separation distance; and
   assigning colors to vertices of the conflict graph such that a number of multiple patterning coloring conflicts in the IC layout is minimized.

8. The computer-implemented method of claim 7, wherein the assigning of the colors to the vertices comprises:
   determining vertices of the conflict graph that should be assigned a same first color;
   assigning the first color to the determined vertices; and
   using a greedy coloring scheme to assign colors to vertices that have not yet been colored.

9. The computer-implemented method of claim 7, wherein the multiple colors comprise three or more colors, and wherein the assigning of the colors to the vertices comprises:
   detecting in the conflict graph one or more kite lists, a kite list comprising multiple kites connected through common end vertices, wherein a kite is a graph including two triangles sharing one common edge, the two vertices of the kite not on the common edge being end vertices;
   for each detected kite list, assigning a same color to all end vertices of the kite list; and using a greedy coloring scheme to assign colors to vertices that have not yet been colored.

10. The computer-implemented method of claim 1, wherein the multiple colors comprise three or more colors.

11. A system for generating a multiple patterning lithography (MPL) compliant integrated circuit layout, the system comprising:
a processing system; and
computer-readable memory in communication with the processing system encoded with instructions for commanding the processing system to execute steps comprising:
assembling a plurality of integrated circuit (IC) cells to form an IC layout, the IC layout including at least two IC cells that have adjoining cell boundaries;
after the assembling of the IC cells, executing a decomposition algorithm to assign multiple colors to design shapes within the IC layout;
detecting multiple patterning coloring conflicts in the IC layout after the assigning of the colors to the design shapes, wherein a number N conflicts are detected;
executing a fixing algorithm under which a conflict present in two abutting IC cells is fixed by flipping or shifting at least one of the abutting IC cells;
determining a number M of conflicts still present in the IC layout
re-executing the fixing algorithm based on a determination that M is less than N; and
performing no further conflict fixing based on a determination that (i) M is equal to zero, or (ii) M is greater than or equal to N; and
a photolithography exposure system configured to use the MPL compliant integrated circuit layout to fabricate an integrated circuit.

12. The system of claim 11, wherein the executing of the fixing algorithm comprises:
flipping one of the adjoining IC cells, a position of the flipped IC cell in the IC layout being unchanged by the flipping;
determining whether the conflict in the two adjoining IC cells is still present after the flipping;
based on a determination that the conflict is still present, shifting one of the adjoining IC cells until the conflict is fixed.

13. The system of claim 11, wherein the execution of the steps further comprises:
using the processing system to execute a color swapping algorithm under which color assignments of neighboring design shapes are exchanged in a manner that fixes one or more coloring conflicts in the IC layout.

14. The system of claim 13, wherein the execution of the color swapping algorithm comprises:
generating a conflict graph from the IC layout, wherein the conflict graph includes (i) vertices representing design shapes of the IC layout, and (ii) edges that connect two vertices when a distance between the corresponding design shapes is less than a minimum separation distance; and
identifying a first vertex corresponding to a design shape of the IC layout that has not yet been assigned a color;
identifying a second vertex connected to the first vertex via an edge, the second vertex corresponding to a design shape in the IC layout that has been assigned a first color; and
exchanging the color assignments of the first and second vertices such that the first vertex is assigned the first color and the second vertex is uncolored.

15. The system of claim 11, wherein the plurality of IC cells have a multiple patterning design layer including design shapes that are assigned three different colors during the execution of the decomposition algorithm.

16. The system of claim 11, wherein the executing of the decomposition algorithm comprises:
generating a conflict graph from the IC layout, wherein the conflict graph includes (i) vertices representing design shapes of the IC layout, and (ii) edges that connect two vertices when a distance between the corresponding design shapes is less than a minimum separation distance; and
assigning colors to vertices of the conflict graph such that a number of multiple patterning coloring conflicts in the IC layout is minimized.

17. The system of claim 16, wherein the multiple colors comprise three or more6 colors, and wherein the assigning of the colors to the vertices comprises:
detecting in the conflict graph one or more kite lists, a kite list comprising multiple kites connected through common end vertices, wherein a kite is a graph including two triangles sharing one common edge, the two vertices of the kite not on the common edge being end vertices;
for each detected kite list, assigning a same color to all end vertices of the kite list; and
using a greedy coloring scheme to assign colors to vertices that have not yet been colored.

18. A non-transitory computer-readable storage medium for generating a multiple patterning lithography (MPL) compliant integrated circuit layout, the computer-readable storage medium comprising computer executable instructions which, when executed, cause a processing system to execute steps including:
assembling a plurality of integrated circuit (IC) cells to form an IC layout, the IC layout including at least two IC cells that have adjoining cell boundaries;
after the assembling of the IC cells, executing a decomposition algorithm to assign multiple colors to design shapes within the IC layout;
detecting multiple patterning coloring conflicts in the IC layout after the assigning of the colors to the design shapes, wherein a number N conflicts are detected;
executing a fixing algorithm under which a conflict present in two abutting IC cells is fixed by flipping or shifting at least one of the abutting IC cells;
determining a number M of conflicts still present in the IC layout;
re-executing the fixing algorithm based on a determination that M is less than N; and
performing no further conflict fixing based on a determination that (i) M is equal to zero, or (ii) M is greater than or equal to N;
wherein the MPL compliant integrated circuit layout is used to fabricate an integrated circuit.

* * * * *